(12) United States Patent
Zhang

(10) Patent No.: US 11,302,852 B2
(45) Date of Patent: Apr. 12, 2022

(54) DISPLAY PANEL AND METHOD OF MANUFACTURING DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Lijun Zhang, Shenzhen (CN)

( * ) Notice: Subject to any disclaimer, the term of this patent is extended or adjusted under 35 U.S.C. 154(b) by 144 days.

(21) Appl. No.: 16/616,506

(22) PCT Filed: Aug. 5, 2019

(86) PCT No.: PCT/CN2019/099289
§ 371 (c)(1),
(2) Date: Nov. 25, 2019

(87) PCT Pub. No.: WO2020/232835
PCT Pub. Date: Nov. 26, 2020

(65) Prior Publication Data
US 2021/0336105 A1 Oct. 28, 2021

(30) Foreign Application Priority Data
May 21, 2019 (CN) .......................... 201910421897.8

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01); *H01L 2933/0066* (2013.01)

(58) Field of Classification Search
CPC .................. H01L 33/62; H01L 33/005; H01L 2933/0066
See application file for complete search history.

(56) References Cited

U.S. PATENT DOCUMENTS

| 7,011,987 | B2 | 3/2006 | Wu | |
| 2014/0367633 | A1* | 12/2014 | Bibi | H01L 27/322 257/13 |
| 2015/0137153 | A1 | 5/2015 | Bibl et al. | |
| 2016/0300988 | A1* | 10/2016 | Oh | H01L 33/54 |
| 2018/0158847 | A1 | 6/2018 | Chang et al. | |
| 2019/0189604 | A1 | 6/2019 | Lu | |

FOREIGN PATENT DOCUMENTS

| CN | 104900621 A | 9/2015 |
| CN | 104952899 A | 9/2015 |
| CN | 107170773 A | 9/2017 |
| CN | 109216376 A | 1/2019 |

\* cited by examiner

*Primary Examiner* — Feifei Yeung Lopez

(57) ABSTRACT

A display panel and a method of manufacturing a display panel are provided. In a solution, a plurality of grooves are formed on at least one metal layer by an etching process, and a connection portion and the at least one metal layer are connected by an adhesive. The adhesive can flow into the grooves during a bonding process to form a plurality of protrusions to fill the grooves, thereby increasing a contact area with the at least one metal layer and increasing bonding strength between the adhesive and the at least one metal layer. It is possible to avoid poor soldering, dark spots, and the like of a light emitting device.

16 Claims, 3 Drawing Sheets

DISPLAY PANEL AND METHOD OF MANUFACTURING DISPLAY PANEL

FIELD OF INVENTION

The present disclosure relates to the field of display technologies, and more particularly to a display panel and a method of manufacturing a display panel.

BACKGROUND OF INVENTION

With the development of display technologies, micro light emitting diodes (LEDs) have been gradually applied to electronic devices due to their high brightness, good luminous efficiency, and low power consumption.

However, due to special requirements of epitaxial substrates and epitaxial processes of the micro LEDs, the micro LEDs cannot be directly disposed on a thin film transistor (TFT). Therefore, after a fabrication of the micro LEDs is completed, the micro LEDs need to be electrically connected to a substrate through a bonding process.

Due to a small size of a connection portion of the micro LED, after the bonding process, the micro LED may have issues such as chip falling or virtual connection, resulting in poor soldering of the micro LED and dark spots.

SUMMARY OF INVENTION

An embodiment of the present disclosure provides a display panel and a method of manufacturing a display panel, which can avoid occurrence of poor soldering and dark spots in a light emitting device, thereby improving display performance of the display panel.

In a first aspect, an embodiment of the present disclosure provides a display panel. The display panel includes a substrate layer, a thin film transistor layer, a light emitting device, and a soldering portion. The thin film transistor layer is disposed on the substrate layer and includes at least one metal layer disposed on a side of the thin film transistor layer away from the substrate layer. The at least one metal layer includes a plurality of grooves. The light emitting device is disposed on the side of the thin film transistor layer away from the substrate layer and includes a light emitting portion and a connection portion. The connection portion is configured to be electrically connected to the light emitting portion and the at least one metal layer. The soldering portion is electrically connected between the connection portion and the at least one metal layer and includes a plurality of protrusions filled in the grooves.

In an embodiment of the present disclosure, the at least one metal layer is a single metal layer or a plurality of metal layers.

In an embodiment of the present disclosure, the thin film transistor layer includes a gate layer, a gate insulating layer, a semiconductor layer, and a source and drain layer sequentially disposed on the substrate layer.

In an embodiment of the present disclosure, the at least one metal layer is the source and drain layer.

In an embodiment of the present disclosure, the at least one metal layer is disposed and electrically connected to the source and drain layer.

In an embodiment of the present disclosure, the at least one metal layer includes a first sub-metal layer and a second sub-metal layer, the connection portion includes a first sub-connection portion and a second sub-connection portion, and the soldering portion includes a first sub-soldering portion and a second sub-soldering portion.

In an embodiment of the present disclosure, the first sub-soldering portion is electrically connected between the first sub-metal layer and the first sub-connection portion, and the second sub-soldering portion is electrically connected between the second sub-metal layer and the second sub-connection portion.

In an embodiment of the present disclosure, the first sub-metal layer and the second sub-metal layer have a gap therebetween.

In a second aspect, an embodiment of the present disclosure provides a method of manufacturing a display panel. The method includes providing a substrate, forming a thin film transistor layer including at least one metal layer on the substrate, forming a plurality of grooves on the at least one metal layer by an etching process, providing a light emitting device comprising a light emitting portion and a connection portion, and providing an adhesive to connect the connection portion and the at least one metal layer, wherein the adhesive is filled in the grooves.

In an embodiment of the present disclosure, the at least one metal layer is a single metal layer or a plurality of metal layers.

In an embodiment of the present disclosure, the thin film transistor layer includes a gate layer, a gate insulating layer, a semiconductor layer, and a source and drain layer sequentially disposed on the substrate layer.

In an embodiment of the present disclosure, the at least one metal layer is the source and drain layer.

In an embodiment of the present disclosure, the at least one metal layer is disposed and electrically connected to the source and drain layer.

In an embodiment of the present disclosure, the at least one metal layer includes a first sub-metal layer and a second sub-metal layer, the connection portion includes a first sub-connection portion and a second sub-connection portion, and the soldering portion includes a first sub-soldering portion and a second sub-soldering portion.

In an embodiment of the present disclosure, the first sub-soldering portion is electrically connected between the first sub-metal layer and the first sub-connection portion, and the second sub-soldering portion is electrically connected between the second sub-metal layer and the second sub-connection portion.

In an embodiment of the present disclosure, the first sub-metal layer and the second sub-metal layer have a gap therebetween.

Beneficial effects of an embodiment of the present disclosure are that, in the method of manufacturing the display panel and the display panel provided by the embodiment of the present disclosure, the display panel includes a substrate layer, a thin film transistor layer, a light emitting device, and a soldering portion. The thin film transistor layer is disposed on the substrate layer and includes at least one metal layer disposed on a side of the thin film transistor layer away from the substrate layer. The at least one metal layer includes a plurality of grooves. The light emitting device is disposed on the side of the thin film transistor layer away from the substrate layer and includes a light emitting portion and a connection portion. The connection portion is configured to be electrically connected to the light emitting portion and the at least one metal layer. The soldering portion is electrically connected between the connection portion and the at least one metal layer and includes a plurality of protrusions filled in the grooves. The solution of the embodiment can avoid occurrence of poor soldering and dark spots in the light emitting device, thereby improving display performance of the display panel.

DETAILED DESCRIPTION OF PREFERRED EMBODIMENTS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

An embodiment of the present disclosure provides a display panel and a method of manufacturing a display panel, which will be separately described in detail below.

Figure 1:
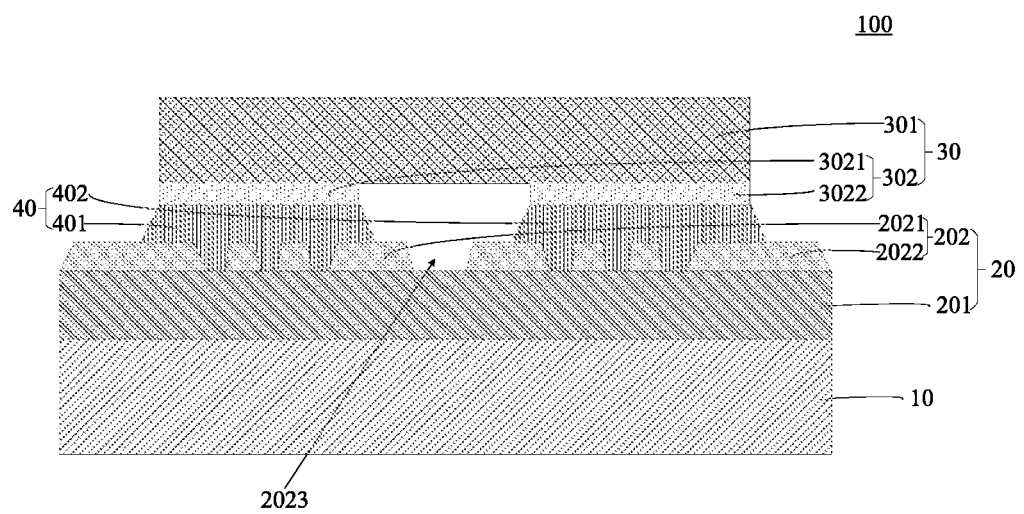
FIG. 1 is a schematic structural view of a display panel according to an embodiment of the present disclosure.

Referring to FIG. 1, FIG. 1 is a schematic structural view of a display panel according to an embodiment of the present disclosure. In a display panel 100 of an embodiment of the present disclosure, the display panel 100 includes a substrate layer 10, a thin film transistor layer 20, a light emitting device 30, and a soldering portion 40.

Material of the substrate layer 10 may include glass, quartz, sapphire, or indium tin oxide (ITO). It can be noted that the material of the substrate layer 10 includes, but is not limited to, the above material.

The thin film transistor layer 20 is disposed on the substrate layer 10. The thin film transistor layer 20 may include a thin film layer 201 and at least one metal layer 202.

The thin film layer 201 may include film layers such as a gate layer, a gate insulating layer, a semiconductor layer, and a source and drain layer. In some embodiments, film layers such as a gate layer, a gate insulating layer, a semiconductor layer, and a source and drain layer may be sequentially disposed on the substrate layer 10.

The at least one metal layer 202 is disposed on a side of the thin film transistor layer 20 away from the substrate layer 10. The at least one metal layer 202 may be a single metal layer or a plurality of metal layers. For example, an alloy of one or more of molybdenum (Mo), aluminum (Al), copper (Cu), and titanium (Ti).

The at least one metal layer 202 may include a first sub-metal layer 2021 and a second sub-metal layer 2022. The first sub-metal layer 2021 and the second sub-metal layer 2022 is provided with a gap 2023 therebetween. The gap 2023 is configured to isolate the first sub-metal layer 2021 and the second sub-metal layer 2022 to prevent a short circuit.

Figure 2:
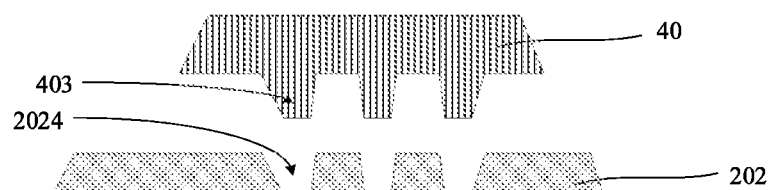
FIG. 2 is a schematic structural view of an intermediate product of a display panel according to an embodiment of the present disclosure.
Figure 3:
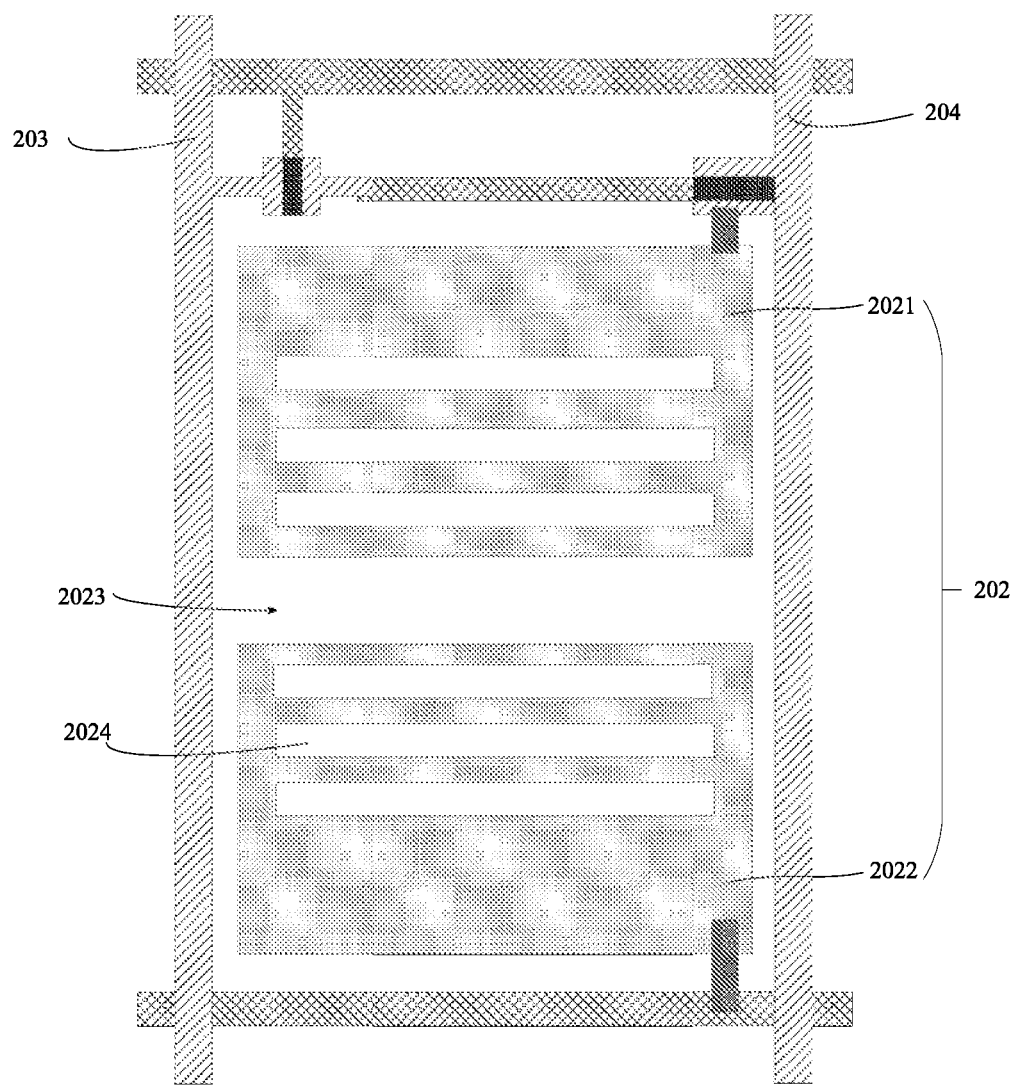
FIG. 3 is a schematic structural view of a thin film transistor layer according to an embodiment of the present disclosure.

Referring to FIG. 1, FIG. 2, and FIG. 3, the at least one metal layer 202 is provided a plurality of grooves 2024 thereon. In a specific implementation, the grooves 2024 may have a regular shape such as a rectangle, a square, or the like. The grooves 2024 can also be irregular in shape. In some embodiments, a very small via hole (not shown) may be disposed on a side of each of the grooves 2024 adjacent to a data line 203 or a data line 204, and the small via hole penetrates a side of the at least one metal layer 202 adjacent to the data line 203 or the data line 204. Air in the grooves 2024 is removed during subsequent soldering process, such that a solder material can completely or nearly completely fill the grooves 2024, thereby increasing a contact area.

In some embodiments, the at least one metal layer 202 can be the source and drain layer in the thin film layer 201. The at least one metal layer 202 can also be disposed on the source and drain layer and is electrically connected to the source and drain layer. For example, when an insulating layer is disposed on the source and drain layer, a source/drain contact hole (not shown) may be disposed on the insulating layer, such that the metal layer 202 can be electrically connected to the source and drain layer.

The light emitting device 30 is disposed on a side of the thin film transistor layer 20 away from the substrate layer 10. The light emitting device 30 may include a light emitting portion 301 and a connection portion 302. In some embodiments, the light emitting portion 301 can be a micro light emitting diode (LED) light. It can be noted that the light emitting portion 301 may be another micro light. The connection portion 302 is configured to be electrically connected to the light emitting portion 301 and the at least one metal layer 202.

The soldering portion 40 is disposed between the connection portion 302 and the at least one metal layer 202. The soldering portion 40 is configured to be electrically connected to the connection portion 302 and the at least one metal layer 202.

The soldering portion 40 may include a first sub-soldering portion 401 and a second sub-soldering portion 402. The first sub-soldering portion 401 is electrically connected between the first sub-metal layer 2021 and the first connection portion 3021. The second sub-soldering portion 402 is electrically connected between the second sub-metal layer 2022 and the second connection portion 3022.

The soldering portion 40 is provided with a plurality of protrusions 403 thereon. The protrusions 403 are filled in the grooves 2024.

The display panel 100 of the embodiment is provided with a plurality of grooves 2024 on the at least one metal layer 202 and a plurality of protrusions 403 on the soldering portion 40. The filling of the protrusions 403 in the grooves 2024 increases a contact area of the soldering portion 40 with the at least one metal layer 202, thereby increasing bonding strength between the soldering portion 40 and the at least one metal layer 202. It is possible to avoid occurrence of poor soldering, dark spots, and the like of the light emitting device 30, thereby improving display performance of the display panel 100.

Figure 4:
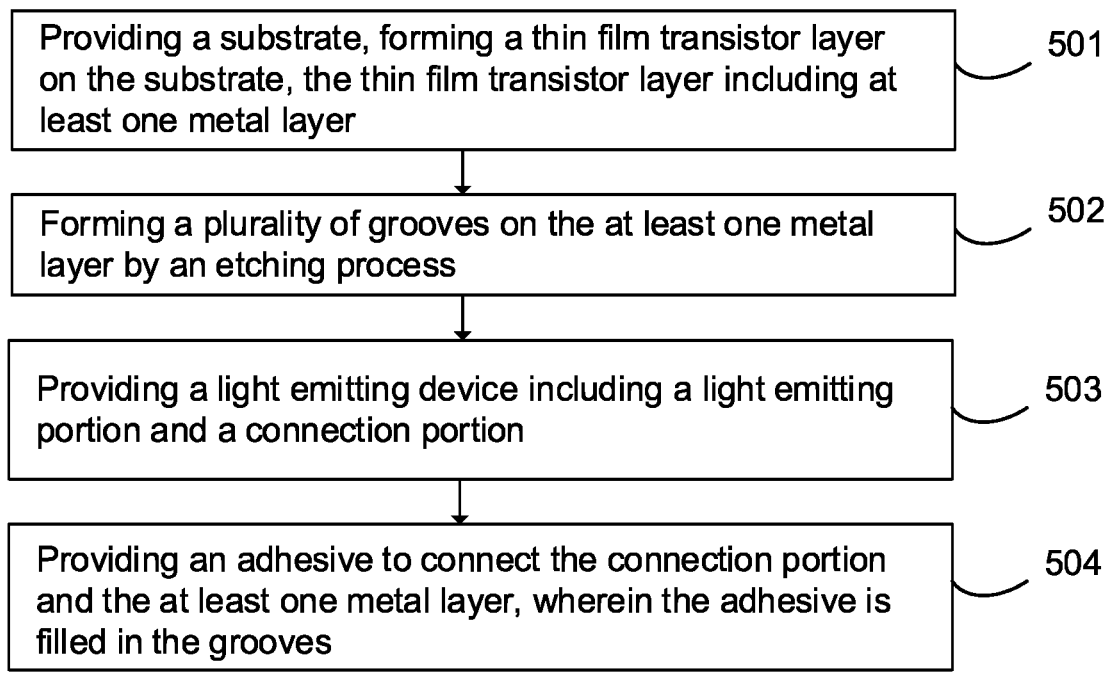
FIG. 4 is a schematic flowchart of a method of manufacturing a display panel according to an embodiment of the present disclosure.

Referring to FIG. 4, FIG. 4 is a schematic flowchart of a method of manufacturing a display panel according to an embodiment of the present disclosure. The specific process of the method of manufacturing the display panel can be as follows.

In a step 501, a substrate 10 is provided, and a thin film transistor layer 20 is formed on the substrate 10. The thin film transistor layer 20 includes at least one metal layer 202.

The thin film transistor layer 20 may include a thin film layer 201 and at least one metal layer 202. The thin film layer 201 may include film layers such as a gate layer, a gate insulating layer, a semiconductor layer, and a source and drain layer. In some embodiments, film layers such as a gate layer, a gate insulating layer, a semiconductor layer, and a source and drain layer may be sequentially disposed on the substrate layer 10.

The at least one metal layer 202 is disposed on a side of the thin film transistor layer 20 away from the substrate layer 10. The at least one metal layer 202 may be a single metal layer or a plurality of metal layers. For example, an alloy of one or more of molybdenum (Mo), aluminum (Al), copper (Cu), and titanium (Ti).

The at least one metal layer 202 may include a first sub-metal layer 2021 and a second sub-metal layer 2022. The first sub-metal layer 2021 and the second sub-metal layer 2022 is provided with a gap 2023 therebetween. The gap 2023 is configured to isolate the first sub-metal layer 2021 and the second sub-metal layer 2022 to prevent a short circuit.

In some embodiments, the at least one metal layer 202 can be the source and drain layer in the thin film layer 201. The at least one metal layer 202 can also be disposed on the source and drain layer and is electrically connected to the source and drain layer. For example, when an insulating layer is disposed on the source and drain layer, a source/drain contact hole (not shown) may be disposed on the insulating layer, such that the metal layer 202 can be electrically connected to the source and drain layer.

In a step 502, a plurality of grooves 2024 are formed on the at least one metal layer 202 by an etching process.

For example, the at least one metal layer 202 can be etched by an inductively coupled plasma etch process to form a plurality of grooves 2024 in the at least one metal layer 202.

In a step 503, a light emitting device 30 is provided. The light emitting device 30 includes a light emitting portion 301 and a connection portion 302.

The light emitting device 30 is disposed on a side of the thin film transistor layer 20 away from the substrate layer 10. The light emitting device 30 may include a light emitting portion 301 and a connection portion 302. In some embodiments, the light emitting portion 301 can be a micro light emitting diode (LED) light. It can be noted that the light emitting portion 301 may be another micro light. The connection portion 302 is configured to be electrically connected to the light emitting portion 301 and the at least one metal layer 202.

In a step 504, an adhesive is provided, and the connection portion 302 and the at least one metal layer 202 are connected by the adhesive, and the adhesive is filled in the grooves 2024.

In details, the adhesive may flow into the grooves 2024 during a bonding process to form a plurality of protrusions 403 to fill the grooves 2024. After the adhesive is cured, the soldering portion 40 in the above embodiment can be formed.

It can be understood that the adhesive is a conductive material. The soldering portion 40 can be used to electrically connect the connection portion 302 and the at least one metal layer 202.

The soldering portion 40 may include a first sub-soldering portion 401 and a second sub-soldering portion 402. The first sub-soldering portion 401 is electrically connected between the first sub-metal layer 2021 and the first connection portion 3021. The second sub-soldering portion 402 is electrically connected between the second sub-metal layer 2022 and the second connection portion 3022.

In the embodiment, a plurality of grooves 2024 are formed on the at least one metal layer 202 by an etching process, and the connection portion 302 and the at least one metal layer 2024 are connected by an adhesive. The adhesive can flow into the grooves 2024 during a bonding process to form the protrusions 403 to fill the grooves 2024, thereby increasing a contact area with the metal layer 202, increasing adhesion strength of the adhesive to the metal layer 202. It is possible to avoid occurrence of poor soldering, dark spots, and the like of the light emitting device 301, thereby improving display performance of the display panel 100.

It can be noted that the display panel formed by the method of manufacturing the display panel provided in the embodiment is the same as the above-mentioned display panel. For details, refer to the above embodiments, and no further details are provided herein.

In the above embodiments, the descriptions of the various embodiments are different, and the details that are not detailed in a certain embodiment can be referred to the related descriptions of other embodiments. The display panel and the method of manufacturing the display panel provided by the embodiments of the present disclosure are described in detail. The principles and implementation manners of the present disclosure are described in the specific examples. The description of the above embodiments is only for helping to understand the technical solution of the present disclosure and its core ideas. it can be understood by those skilled in the art that the technical solutions described in the foregoing embodiments may be modified, or some of the technical features may be equivalently replaced, and the modifications or replacements do not depart from the scope of the technical solutions of the embodiments of the present disclosure.

What is claimed is:

1. A liquid panel, comprising:
    a substrate layer;
    a thin film transistor layer disposed on the substrate layer and comprising at least one metal layer disposed on a side of the thin film transistor layer away from the substrate layer, and the at least one metal layer comprising a plurality of grooves;
    a light emitting device disposed on the side of the thin film transistor layer away from the substrate layer and comprising a light emitting portion and a connection portion, wherein the connection portion is configured to be electrically connected to the light emitting portion and the at least one metal layer;
    a soldering portion electrically connected between the connection portion and the at least one metal layer and comprising a plurality of protrusions filled in the grooves; and
    a data line;
    wherein a via hole is disposed on a side of each of the grooves adjacent to the data line, and the via hole penetrates a side of the at least one metal layer adjacent to the data line.

2. The display panel according to claim 1, wherein the at least one metal layer is a plurality of metal layers.

3. The display panel according to claim 1, wherein the thin film transistor layer comprises a gate layer, a gate insulating layer, a semiconductor layer, and a source and drain layer sequentially disposed on the substrate layer.

4. The display panel according to claim 3, wherein the at least one metal layer is the source and drain layer.

5. The display panel according to claim 3, wherein the at least one metal layer is disposed and electrically connected to the source and drain layer.

6. The display panel according to claim 1, wherein the at least one metal layer comprises a first sub-metal layer and a second sub-metal layer, the connection portion comprises a first sub-connection portion and a second sub-connection portion, and the soldering portion comprises a first sub-soldering portion and a second sub-soldering portion.

7. The display panel according to claim 6, wherein the first sub-soldering portion is electrically connected between the first sub-metal layer and the first sub-connection portion, and the second sub-soldering portion is electrically connected between the second sub-metal layer and the second sub-connection portion.

8. The display panel according to claim 6, wherein the first sub-metal layer and the second sub-metal layer have a gap therebetween.

9. A method of manufacturing a display panel, comprising:
provideing a substrate, forming a thin film transistor layer on the substrate, the thin film transistor layer comprising at least one metal layer;
forming a plurality of grooves on the at least one metal layer by an etching process;
providing a light emitting device comprising a light emitting portion and a connection portion; and
providing an adhesive to connect the connection portion and the at least one metal layer, wherein the adhesive is filled in the grooves;
wherein a via hole is disposed on a side of each of the grooves adjacent to a data line, and the via hole penetrates a side of the at least one metal layer adjacent to the data line.

10. The method according to claim 9, wherein the at least one metal layer is a plurality of metal layers.

11. The method according to claim 9, wherein the thin film transistor layer comprises a gate layer, a gate insulating layer, a semiconductor layer, and a source and drain layer sequentially disposed on the substrate layer.

12. The method according to claim 11, wherein the at least one metal layer is the source and drain layer.

13. The method according to claim 11, wherein the at least one metal layer is disposed and electrically connected to the source and drain layer.

14. The method according to claim 9, wherein the at least one metal layer comprises a first sub-metal layer and a second sub-metal layer, the connection portion comprises a first sub-connection portion and a second sub-connection portion, and the soldering portion comprises a first sub-soldering portion and a second sub-soldering portion.

15. The method according to claim 14, wherein the first sub-soldering portion is electrically connected between the first sub-metal layer and the first sub-connection portion, and the second sub-soldering portion is electrically connected between the second sub-metal layer and the second sub-connection portion.

16. The method according to claim 14, wherein the first sub-metal layer and the second sub-metal layer have a gap therebetween.

* * * * *